(12) United States Patent
Kolze et al.

(10) Patent No.: US 7,626,418 B1
(45) Date of Patent: Dec. 1, 2009

(54) CONFIGURABLE INTERFACE

(75) Inventors: Paige A. Kolze, Mountain View, CA (US); Laurent F. Stadler, San Francisco, CA (US); Patrick C. McCarthy, San Francisco, CA (US)

(73) Assignee: Xilinx, Inc., San Jose, CA (US)

( * ) Notice: Subject to any disclaimer, the term of this patent is extended or adjusted under 35 U.S.C. 154(b) by 0 days.

(21) Appl. No.: 11/803,516

(22) Filed: May 14, 2007

(51) Int. Cl.
H03K 19/177 (2006.01)
(52) U.S. Cl. .............................. 326/39; 326/41; 326/47
(58) Field of Classification Search ............. 326/37–41; 713/1, 190; 710/306, 317; 345/505; 705/500; 716/17
See application file for complete search history.

(56) References Cited

U.S. PATENT DOCUMENTS

| | | | |
|---|---|---|---|
| 5,781,756 A | 7/1998 | Hung | |
| 5,857,086 A * | 1/1999 | Horan et al. | 710/306 |
| 5,892,961 A | 4/1999 | Trimberger | |
| 6,067,595 A | 5/2000 | Lindenstruth | |
| 6,160,418 A | 12/2000 | Burnham | |
| 6,204,687 B1 | 3/2001 | Schultz et al. | |
| 6,292,021 B1 | 9/2001 | Furtek et al. | |
| 6,522,167 B1 * | 2/2003 | Ansari et al. | 326/39 |
| 6,792,578 B1 | 9/2004 | Brown et al. | |
| 6,903,575 B1 * | 6/2005 | Davidson et al. | 326/47 |
| 6,976,160 B1 | 12/2005 | Yin et al. | |
| 7,003,423 B1 | 2/2006 | Kabani et al. | |
| 7,126,372 B2 * | 10/2006 | Vadi et al. | 326/38 |
| 7,190,190 B1 | 3/2007 | Camarota et al. | |
| 7,200,832 B2 * | 4/2007 | Butt et al. | 716/17 |
| 7,274,213 B1 * | 9/2007 | Meyer et al. | 326/41 |
| 7,328,335 B1 * | 2/2008 | Sundararajan et al. | 713/1 |
| 7,353,162 B2 | 4/2008 | Huang et al. | |

OTHER PUBLICATIONS

"PCI Express PIPE Endpoint LogiCORE Product Specification," DS321 (v1.1), Apr. 11, 2005, pp. 1-14, Xilinx, Inc.
"PCI Express Endpoint Cores v3.4 Product Specification," DS506, Feb. 15, 2007, pp. 1-20, Xilinx, Inc.
U.S. Appl. No. 11/803,521, filed May 14, 2007, Stadler, Laurent Fabris, Hard Macro-to-User Logic Interface, Xilinx, Inc. 2100 Logic Drive, San Jose, Ca 95124.
U.S. Appl. No. 11/803,522, filed May 14, 2007, Tran, Dai D., et al., Interface Device Reset, Xilinx, Inc. 2100 Logic Drive, San Jose, Ca 95124.
U.S. Appl. No. 11/803,556, filed May 14, 2007, McCarthy, Patrick C., et al., Interface Device Lane Configuration, Xilinx, Inc. 2100 Logic Drive, San Jose, Ca 95124.
U.S. Appl. No. 11/803,517, filed May 14, 2007, Case, Jerry A., Reconfiguration of a Hard Macro Via Configuration Registers, Xilinx, Inc. 2100 Logic Drive, San Jose, Ca 95124.

* cited by examiner

Primary Examiner—James H. Cho
Assistant Examiner—Crystal L Hammond
(74) Attorney, Agent, or Firm—W. Eric Webostad

(57) ABSTRACT

A configurable interface for an integrated circuit is described. The integrated circuit includes a first core, where the first core is an application specific circuit version of a Peripheral Component Interconnect Express ("PCIe") interface device. First configuration memory cells are associated with the first core, and the first configuration memory cells are for configuring the first core. The first configuration memory cells are programmable responsive to a first portion of a configuration bitstream, and the configuration bitstream is capable of including user-logic information for programming programmable logic of the integrated circuit.

20 Claims, 8 Drawing Sheets

CONFIGURABLE INTERFACE

CROSS-REFERENCE TO RELATED APPLICATIONS

This application is related to the following co-pending U.S. patent applications: U.S. patent application entitled "Interface Lane Device Configuration," by Patrick C. McCarthy, et al., U.S. patent application entitled "Interface Device Reset," by Dai D. Tran, et al., U.S. patent application entitled "Hard Macro-to-User Logic Interface," by Laurent Stadler, and U.S. patent application entitled "Reconfiguration of a Hard Macro via Configuration Registers," by Jerry A. Case, each of which was filed on the same day as the present application and each of which is assigned to the assignee of the present application. The entire contents of each of the above-referenced co-pending patent applications are incorporated herein by reference for all purposes.

FIELD OF THE INVENTION

One or more aspects of the invention relate generally to integrated circuits, and, more particularly, to a configurable interface for an integrated circuit.

BACKGROUND OF THE INVENTION

Programmable logic devices ("PLDs") are a well-known type of integrated circuit that can be programmed to perform specified logic functions. One type of PLD, the field programmable gate array ("FPGA"), typically includes an array of programmable tiles. These programmable tiles can include, for example, input/output blocks ("IOBs"), configurable logic blocks ("CLBs"), dedicated random access memory blocks ("BRAMs"), multipliers, digital signal processing blocks ("DSPs"), processors, clock managers, delay lock loops ("DLLs"), and so forth. Notably, as used herein, "include" and "including" mean including without limitation.

One such FPGA is the Xilinx Virtex™ FPGA available from Xilinx, Inc., 2100 Logic Drive, San Jose, Calif. 95124. Another type of PLD is the Complex Programmable Logic Device ("CPLD"). A CPLD includes two or more "function blocks" connected together and to input/output ("I/O") resources by an interconnect switch matrix. Each function block of the CPLD includes a two-level AND/OR structure similar to those used in Programmable Logic Arrays ("PLAs") and Programmable Array Logic ("PAL") devices. Other PLDs are programmed by applying a processing layer, such as a metal layer, that programmably interconnects the various elements on the device. These PLDs are known as mask programmable devices. PLDs can also be implemented in other ways, for example, using fuse or antifuse technology. The terms "PLD" and "programmable logic device" include but are not limited to these exemplary devices, as well as encompassing devices that are only partially programmable.

For purposes of clarity, FPGAs are described below though other types of PLDs may be used. FPGAs may include one or more embedded microprocessors. For example, a microprocessor may be located in an area reserved for it, generally referred to as a "processor block."

Heretofore, performance of a design instantiated in programmable logic of an FPGA ("FPGA fabric") using a Peripheral Component Interconnect ("PCI") Express ("PCIe") internal to such FPGA was limited to performance of a PCIe design for instantiation in FPGA fabric ("soft core"). Additional details regarding examples of PCIe soft cores are available from Xilinx, Inc. of San Jose, Calif. and are described in "PCI Express PIPE Endpoint LogiCORE Product Specification," DS321 (v1.1), Apr. 11, 2005 and in "PCI Express Endpoint Cores v3.4 Product Specification," DS506, Feb. 15, 2007, both available from Xilinx, Inc. Furthermore, area used by such a PCIe soft core was considerable.

PCIe soft cores have been implemented as an "Endpoint" architecture. Target applications for such Endpoint architecture include: test equipment, consumer graphics boards, medical imaging equipment, data communication networks, telecommunication networks, broadband deployments, cross-connects, workstation and mainframe backbones, network interface cards, chip-to-chip and backplane interconnect, crossbar switches, wireless base stations, high bandwidth digital video, and high bandwidth server applications, among other known add-in cards, host bus adapters, and other known applications.

Accordingly, it would be desirable and useful to provide a PCIe Endpoint internal to an FPGA having enhanced performance and reduced area over that of a PCIe soft core instantiated in FPGA fabric.

SUMMARY OF THE INVENTION

One or more aspects of the invention generally relate to integrated circuits, and, more particularly, to a configurable interface for an integrated circuit.

An aspect of the invention is an integrated circuit including a core, where the core is an application specific circuit version of a Peripheral Component Interconnect Express ("PCIe") interface device. Configuration memory cells are associated with the core, and the configuration memory cells are for configuring the core. The configuration memory cells are programmable responsive to a portion of a configuration bitstream, and the configuration bitstream is capable of including user logic information for programming programmable logic of the integrated circuit.

Another aspect of the invention is a method for configuration of an integrated circuit. At least a portion of a column of a columnar programmable logic device is tiled by repeated application of a core, where the core is an application specific circuit version of a Peripheral Component Interconnect Express ("PCIe") interface device. Each instance of the core is configurable responsive to programming configuration memory respectively associated therewith, and allows for a bitstream to be provided to the integrated circuit for configuring the integrated circuit. The bitstream is capable of having information for each instance of the core for programming the configuration memory respectively associated therewith.

BRIEF DESCRIPTION OF THE DRAWINGS

Accompanying drawing(s) show exemplary embodiment(s) in accordance with one or more aspects of the invention; however, the accompanying drawing(s) should not be taken to limit the invention to the embodiment(s) shown, but are for explanation and understanding only.

DETAILED DESCRIPTION OF THE DRAWINGS

In the following description, numerous specific details are set forth to provide a more thorough description of the specific embodiments of the invention. It should be apparent, however, to one skilled in the art, that the invention may be practiced without all the specific details given below. In other instances, well known features have not been described in detail so as not to obscure the invention. For ease of illustration, the same number labels are used in different diagrams to refer to the same items; however, in alternative embodiments the items may be different.

Figure 1:
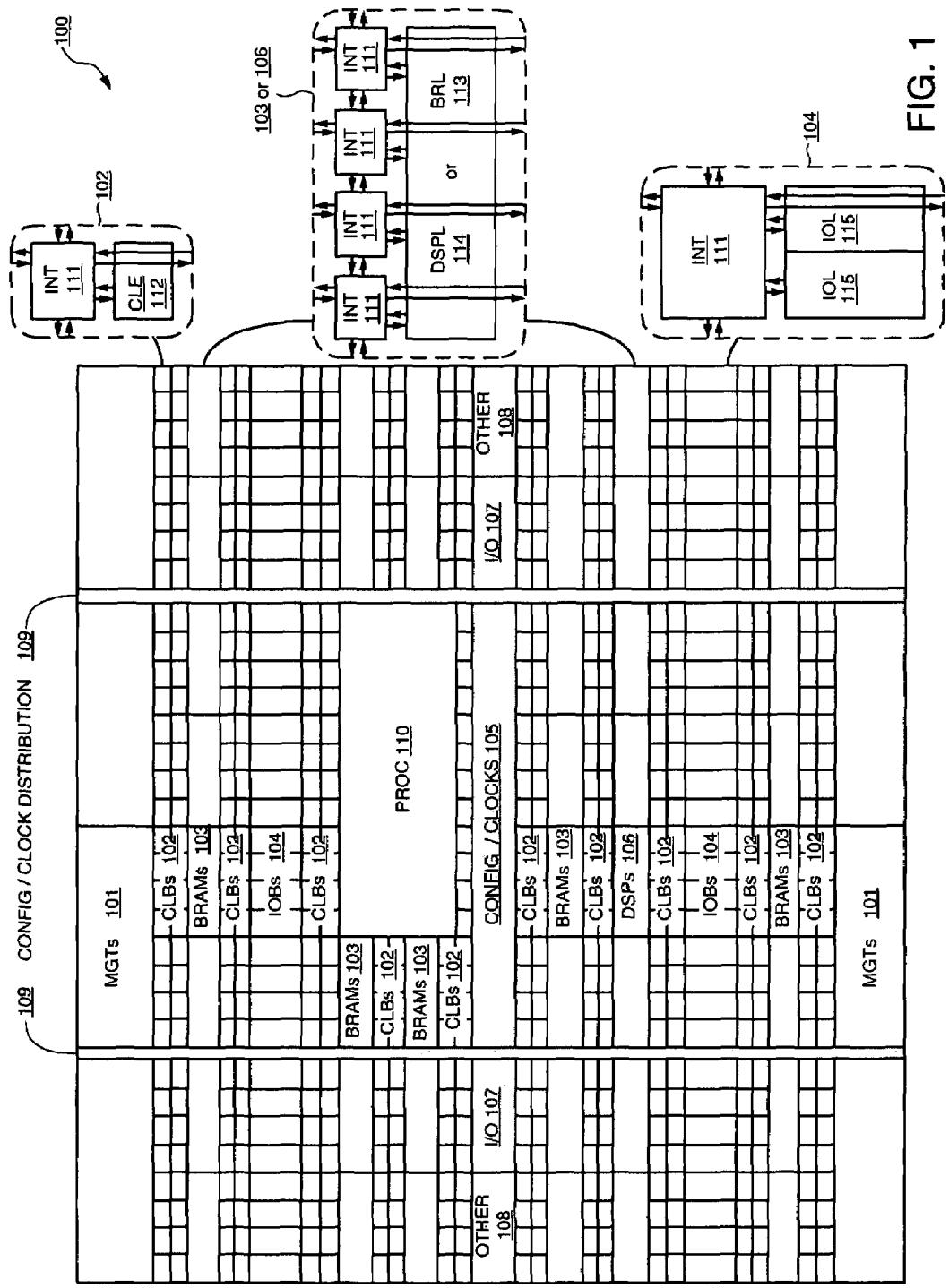
FIG. 1 is a simplified block diagram depicting an exemplary embodiment of a columnar Field Programmable Gate Array ("FPGA") architecture in which one or more aspects of the invention may be implemented.

FIG. 1 illustrates an FPGA architecture 100 that includes a large number of different programmable tiles including multi-gigabit transceivers ("MGTs") 101, configurable logic blocks ("CLBs") 102, random access memory blocks ("BRAMs") 103, input/output blocks ("IOBs") 104, configuration and clocking logic ("CONFIG/CLOCKS") 105, digital signal processing blocks ("DSPs") 106, specialized input/output ports ("I/O") 107 (e.g., configuration ports and clock ports), and other programmable logic 108 such as digital clock managers, analog-to-digital converters, system monitoring logic, and so forth. Some FPGAs also include dedicated processor blocks ("PROC") 110.

In some FPGAs, each programmable tile includes a programmable interconnect element ("INT") 111 having standardized connections to and from a corresponding interconnect element 111 in each adjacent tile. Therefore, the programmable interconnect elements 111 taken together implement the programmable interconnect structure for the illustrated FPGA. Each programmable interconnect element 111 also includes the connections to and from any other programmable logic element(s) within the same tile, as shown by the examples included at the right side of FIG. 1.

For example, a CLB 102 can include a configurable logic element ("CLE") 112 that can be programmed to implement user logic plus a single programmable interconnect element 111. A BRAM 103 can include a BRAM logic element ("BRL") 113 in addition to one or more programmable interconnect elements 111. Typically, the number of interconnect elements included in a tile depends on the height of the tile. In the pictured embodiment, a BRAM tile has the same height as four CLBs, but other numbers (e.g., five) can also be used. A DSP tile 106 can include a DSP logic element ("DSPL") 114 in addition to an appropriate number of programmable interconnect elements 111. An IOB 104 can include, for example, two instances of an input/output logic element ("IOL") 115 in addition to one instance of the programmable interconnect element 111. As will be clear to those of skill in the art, the actual I/O pads connected, for example, to the I/O logic element 115 are manufactured using metal layered above the various illustrated logic blocks, and typically are not confined to the area of the I/O logic element 115.

In the pictured embodiment, a columnar area near the center of the die (shown shaded in FIG. 1) is used for configuration, I/O, clock, and other control logic. Vertical areas 109 extending from this column are used to distribute the clocks and configuration signals across the breadth of the FPGA.

Some FPGAs utilizing the architecture illustrated in FIG. 1 include additional logic blocks that disrupt the regular columnar structure making up a large part of the FPGA. The additional logic blocks can be programmable blocks and/or dedicated logic. For example, the processor block 110 shown in FIG. 1 spans several columns of CLBs and BRAMs.

Note that FIG. 1 is intended to illustrate only an exemplary FPGA architecture. The numbers of logic blocks in a column, the relative widths of the columns, the number and order of columns, the types of logic blocks included in the columns, the relative sizes of the logic blocks, and the interconnect/logic implementations included at the right side of FIG. 1 are purely exemplary. For example, in an actual FPGA more than one adjacent column of CLBs is typically included wherever the CLBs appear, to facilitate the efficient implementation of user logic. FPGA 100 illustratively represents a columnar architecture, though FPGAs of other architectures, such as ring architectures for example, may be used. FPGA 100 may be a Virtex-4™ FPGA from Xilinx of San Jose, Calif.

Figure 2:
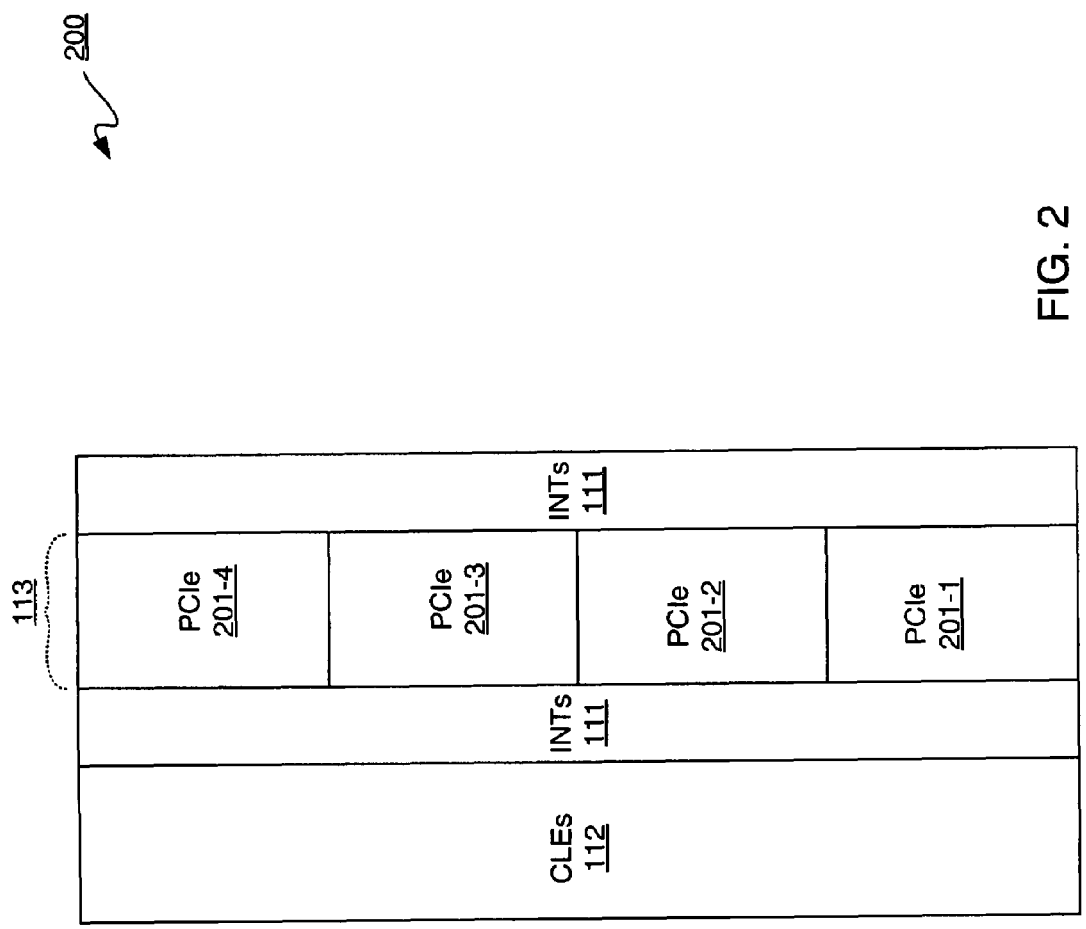
FIG. 2 is a block diagram depicting an exemplary embodiment of a portion of an FPGA with a column of Peripheral Component Interconnect ("PCI") Express ("PCIe") Application Specific Integrated Circuit ("ASIC") cores, namely PCIe hard cores.

FIG. 2 is a block diagram depicting an exemplary embodiment of a portion of an FPGA 200. FPGA 200 may be substantially similar to FPGA 100 of FIG. 1. However, in place of a column of BRLs 113 are located PCIe Application Specific Integrated Circuit ("ASIC") cores, namely PCIe hard cores. Notably, rather than using a column of BRLs 113, other columns in FPGA 100 of FIG. 1 may be used. PCIe hard cores 201-1 through 201-4 are illustratively shown between two columns of INTs 111. Though four PCIe hard cores 201-1 through 201-4 are illustratively shown, fewer or more than four PCIe hard cores may be implemented in an FPGA.

Figure 3:
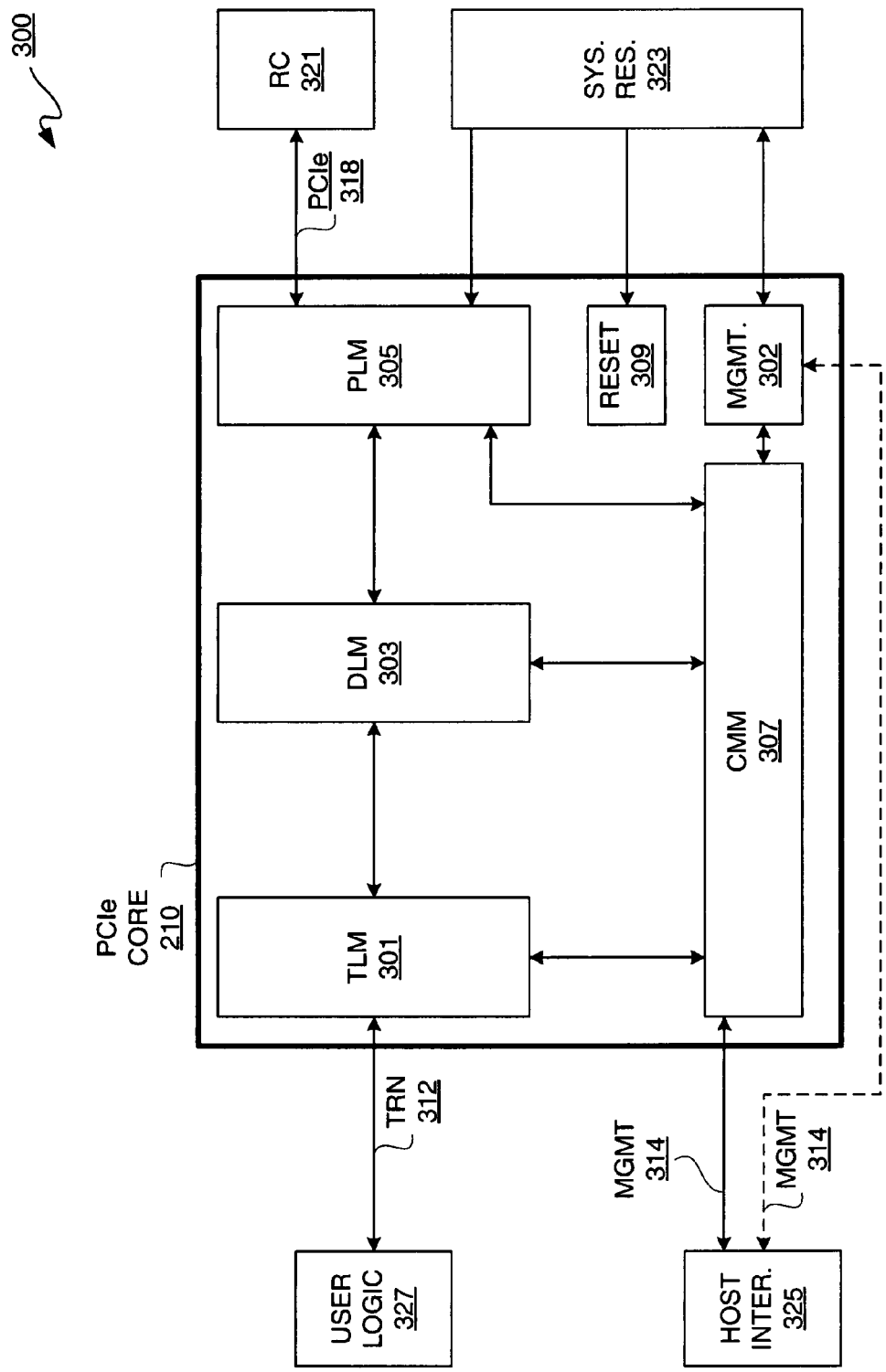
FIG. 3 is a block diagram depicting an exemplary embodiment of a PCIe system.

FIG. 3 is a block diagram depicting an exemplary embodiment of PCIe system 300. PCIe system 300 may be implemented in an FPGA. PCIe system 300 includes a PCIe hard core ("PCIe core") 210, which may be a PCIe hard core of PCIe hard cores 201-1 through 201-4 of FIG. 2, coupled to a Root Complex 321, user logic 327, host interface 325, and system resources 323. PCIe core 210 includes a physical layer module ("PLM") 305, a datalink layer module ("DLM") 303, a transaction layer module ("TLM") 301, a configuration management module ("CMM") 307, a management block 302, and a reset block 309.

Within PCIe core 210, TLM 301 is coupled to DLM 303 for bidirectional communication, and DLM 303 is coupled to PLM 305 for bidirectional communication. Additionally, each of TLM 301, DLM 303, and PLM 305 is coupled to CMM 307 for bidirectional communication. Reset block 309 is coupled to TLM 301, DLM 303, PLM 305, CMM 307, and management block 302, though not illustratively shown in FIG. 3 for purposes of clarity. Management block 302 is coupled via a read/write interface to CMM 307.

PLM 305 is coupled to Root Complex 321 via PCIe interface 318. Additionally, PLM 305 may be coupled to system resources 323 for receiving a clock signal. Reset block 309 may be coupled to system resources 323 for receiving reset signaling. Management block 302 may be coupled to system resources 323 for dynamic configuration and status monitoring. Management interface 314 may couple host interface 325 and CMM 307. Alternatively as indicated by dashed line, management interface 314 may couple host interface 325 to management block 302, and host interface 325 may thus be coupled to CMM 307 via management interface 314 and management block 302. User logic 327, which may be instantiated in FPGA fabric, is coupled to TLM 301 via transaction interface 312. Notably, for purposes of clarity by way of example and not limitation, Root Complex 321 is illustratively shown with PCIe core 210 indicating PCIe core 210 may be an upstream facing "Switch port," "Bridge port," or "Endpoint;" however, more generally, Root Complex 321 should be thought of as a link partner. Accordingly, it should be understood that PCIe core 210 may be upstream or downstream facing. Furthermore, for purposes of clarity by way of example, PCIe core 210 is described below as an "Endpoint;" however, it should be understood that PCIe core 210 may be a Switch port, Bridge port, Root port, or Endpoint.

With continuing reference to FIG. 3, it should be understood that a PCIe core 210 may be what is known as an "Endpoint." Examples of applications of PCIe Endpoints include graphics cards, memory cards, and the like. In this example, a PCIe core 210 is implemented in an FPGA as an ASIC. However, user logic 327 may be configured for an application implemented with FPGA resources which would interface to such PCIe core 210. Additionally, multiple PCIe cores 210 may be coupled to a Root Complex 321 to provide a PCIe network, an example of which is described in additional detail with reference to FIG. 4 below.

Host interface 325 may be an interface to a processor of a processor block 110 of FIG. 1, namely an embedded processor, or may be a host interface to another type of host. Examples of other types of hosts include a microprocessor instantiated in FPGA fabric, such as a MicroBlaze microprocessor available from Xilinx, Inc. of San Jose, Calif. Another example of a host may be a sequencer instantiated in FPGA fabric, or other known host device that may be instantiated in FPGA fabric.

Figure 4:
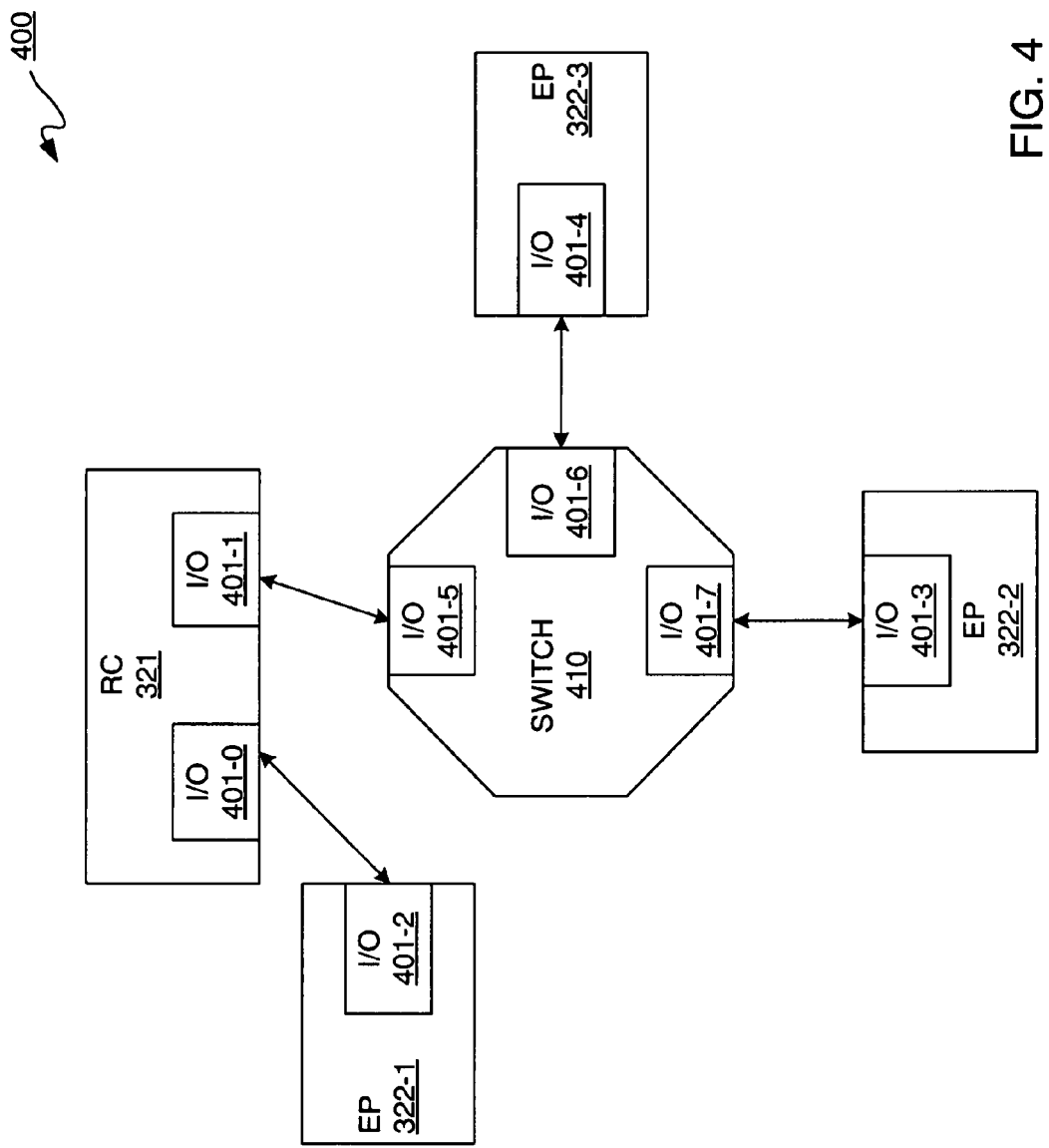
FIG. 4 is a network diagram depicting an exemplary embodiment of a PCIe network.

FIG. 4 is a network diagram depicting an exemplary embodiment of a PCIe network 400. PCIe network 400 includes Root Complex ("RC") 321, and Endpoints ("EPs") 322-1 through 322-3. Although a Root Complex 321 and three Endpoints 322-1 through 322-3 are illustratively shown, it should be appreciated that fewer or more Endpoints may be implemented with a Root Complex. PCIe network 400 may be implemented on a single FPGA, where switch matrix 410 is implemented using programmable interconnects, among other details described below.

Root Complex 321-1 includes I/O blocks 401-0 and 401-1. I/O block 401-0 is directly coupled to I/O block 401-2 of Endpoint 322-1. With reference to FPGA 100 of FIG. 1, I/O blocks 401-0 through 401-2 for example may be implemented using I/O 107 or MGTs 101 of FIG. 1. Moreover, I/O blocks 401-0 through 401-2 for example may be implemented using one or more IOBs 104 of FIG. 1. Root Complex 321 is coupled to Endpoints 322-2 and 322-3 via switch matrix 410. Switch matrix 410 may be implemented as a known PCIe switch block. Accordingly, switch matrix 410 may include I/O blocks 401-5 through 401-7 for respectively coupling to I/O blocks 401-1, 401-4, and 401-3, where I/O blocks 401-3 and 401-4 are respectively of Endpoints 322-2 and 322-3.

Having this understanding of a PCIe network 400, and a PCIe hard core 210 of FIG. 3, both of which may be implemented in an FPGA, a detailed description of a configurable hard macro or hard core, such as a PCIe core, is described.

Figure 5:
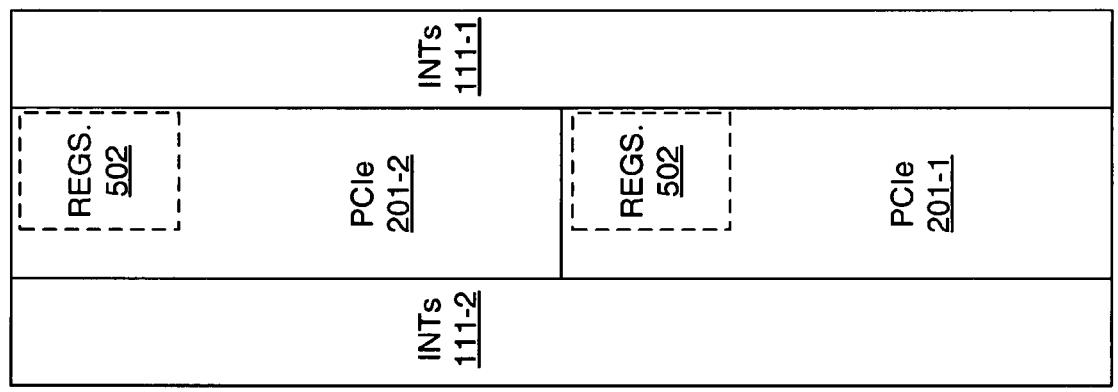
FIG. 5 is a block diagram depicting an exemplary embodiment of a portion of an FPGA including PCIe cores located between columns of interconnects ("INTs").

FIG. 5 is a block diagram depicting an exemplary embodiment of a portion of an FPGA 500 including PCIe cores 201-1 and 201-2 located between respective columns of INTs 111-1 and 111-2. As is known, a PCIe specification indicates various configuration settings. Heretofore, these configuration settings were not user accessible but were set by the manufacturer of the PCIe core, with respect to a hard macro implementation. Notably, FPGA 500 may be an FPGA such as FPGA 100 of FIG. 1.

However, PCIe cores 201-1 and 201-2 may be configured at power up by including PCIe configuration information in an FPGA configuration bitstream. Thus, using an FPGA configuration bitstream, any of a variety of different types of PCIe Endpoints, PCIe Root Complexes, PCIe Switches, PCIe Bridges, or Advanced Switching ports may be implemented. Thus, a variety of different aspects associated with a PCIe implementation are configurable using an FPGA configuration bitstream. Additionally, a PCIe hard macro may be reconfigured upon reset of the FPGA. This facilitates flexibility along the lines of a soft macro FPGA implementation, but with the area efficiency and performance associated with a hard macro implementation.

Figure 6:
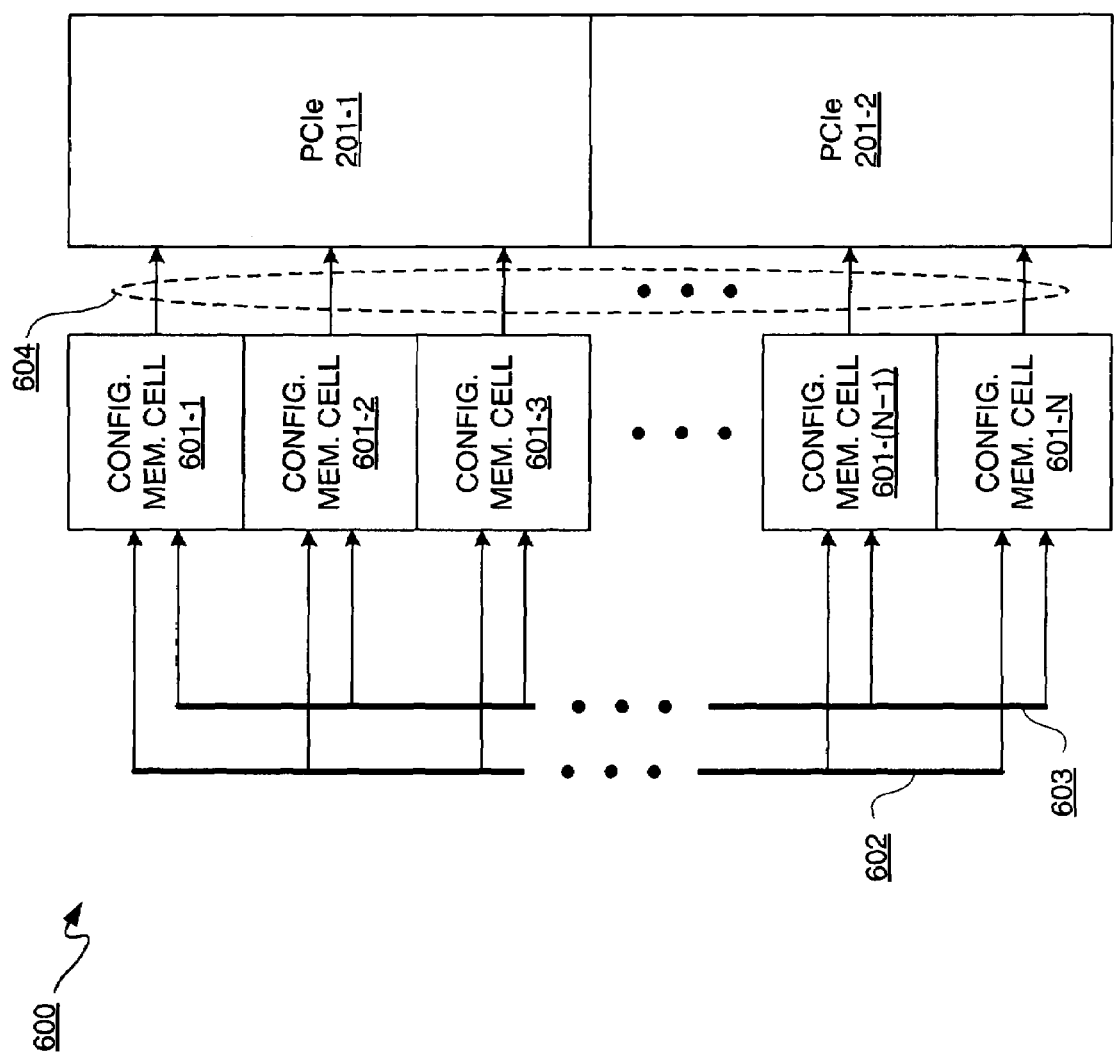
FIG. 6 is a block diagram depicting an exemplary embodiment of driver circuitry used for configuring PCIe cores.

PCIe cores 201-1 and 201-2 may optionally include respective sets of registers 502 for registering outputs of configuration memory cells, such as configuration memory cells 601-1 through 601-N, for N a positive integer substantially greater than one, (collectively "601") of FIG. 6 for example. Output values from such configuration memory cells may be stored in registers 502, and such registers may be overwritten with other information without having to load a new FPGA configuration bitstream into FPGA 500. Additionally, if configuration memory cells may be updated dynamically (while the FPGA remains in operation), for example if the configuration memory cells are Dynamic Reconfiguration Port memory cells as associated with a Xilinx FPGA, PCIe cores 201-1 and 201-2 may be reconfigured while FPGA 500 is operating.

Accordingly, it should be appreciated that by defusing building blocks associated with various port types, such as port types of PCIe or Advanced Switching, into a hard macro, where such building blocks are associated with configuration memory cells, benefits generally associated with ASICs may be achieved with the flexibility generally associated with soft core solutions.

FIG. 6 is a block diagram depicting an exemplary embodiment of driver circuitry 600 used for configuring PCIe cores 201-1 and 201-2. For purposes of clarity by way of example and not limitation, it shall be assumed that optional registers 502 of FIG. 5 are not implemented, even though they may be coupled to receive output 604 of configuration memory cells 601. Configuration memory cells 601 may be part of PCIe cores 201-1 and 201-2. Notably, various aspects of a PCIe or Advanced Switching port are made configurable by using outputs from FPGA configuration memory cells 601 to drive various inputs.

What follows is a list of the options that may be configured. In particular, configurable PCIe and Advanced Switching port settings for a hard macro interface are described below.

Configuration memory cells 601 may be coupled to receive data and address information via data bus 602 and address bus 603. These buses 602 and 603 may be part of an FPGA's busing architecture for configuring configuration memory cells. As configuration of configuration memory cells 601 is well known, it is not described in unnecessary detail. It should be appreciated, however, that for known FPGAs, a column of configuration memory cells, generally one bit wide, may extend beyond 1000 configuration memory cells vertically aligned. While not all of the configuration memory cells in a column need be used for purposes of configuring ports, such as of PCIe cores 201-1 and 201-2, it should be appreciated that a substantially significant number of available configuration memory cells which may be disposed as a column of configuration memory cells facilitates a wide range of configuration options for each of PCIe cores 201-1 and 201-2. Furthermore, it should be appreciated that because a set of configuration memory cells 601-1 through 601-N may divided up into subsets, such subsets may be respectively associated with PCIe cores 201-1 and 201-2, PCIe cores 201-1 and 201-2 need not be configured similarly, but may actually have different configuration settings. Alternatively, PCIe cores 201-1 and 201-2 may have the same configuration settings. Furthermore, again it should be appreciated that even though two PCIe cores 201-1 and 201-2 are illustratively shown, it should be appreciated that fewer or more PCIe cores may be implemented within a column of a columnar PLD, such as FPGA 100 of FIG. 1.

Figure 7:
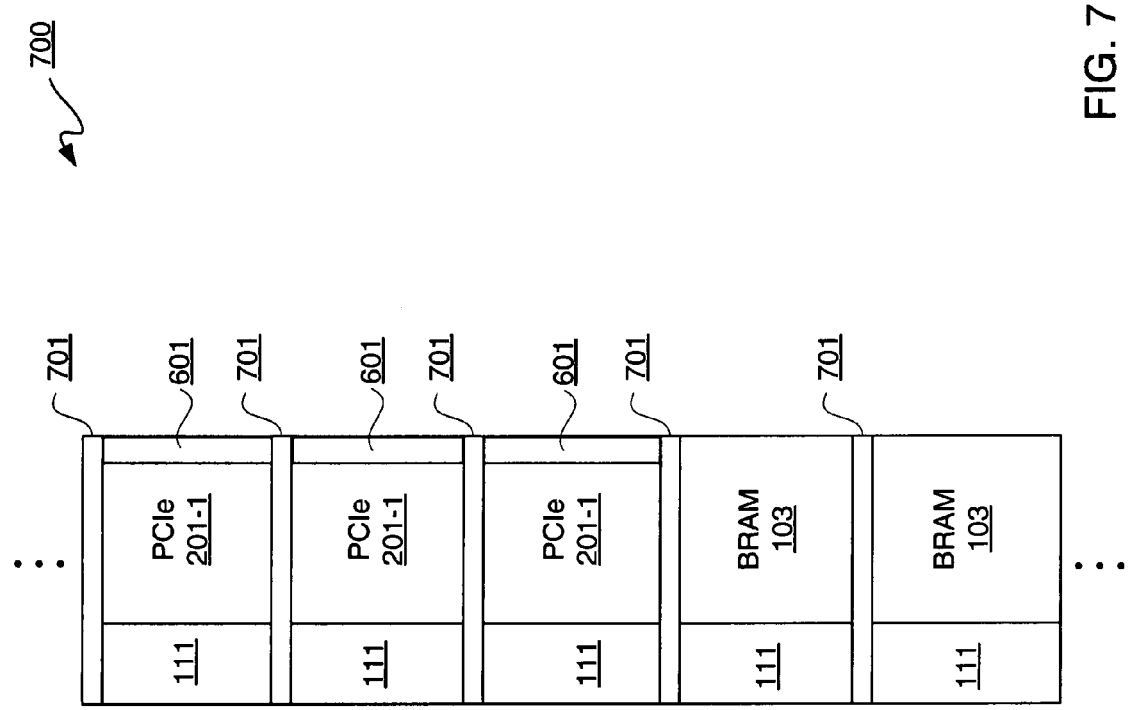
FIG. 7 is a block diagram depicting an exemplary embodiment of a portion of an FPGA having a columnar architecture.

FIG. 7 is a block diagram depicting an exemplary embodiment of a portion of an FPGA 700 having a columnar architecture. FPGA 700 may be FPGA 100 of FIG. 1 having at least one PCIe core, such as PCIe core 201-1, implemented as a hard macro. In FPGA 700, PCIe hard macro 201-1 is implemented as part of a column of BRAMs 103. A column of INTs 111 may be adjacent to the column of a heterogeneous mix of PCIe core 201-1 and BRAMs 103. Notably, even though only a single PCIe core 201-1 is illustratively shown, multiple PCIe cores may be co-located in a column with BRAMs. Additionally, other circuitry other than BRAMs may be co-located in the same column, such as, for example, an Ethernet Media Access Controller block for example. Notably, PCIe core 201-1 is divided up by H clock rows 701. As part of or adjacent to PCIe core 201-1 are configuration memory cells 601, which as illustratively shown may also be divided up by H clock rows 701. Furthermore, it should be appreciated that configuration memory cells 601 are sufficiently narrow such that both PCIe core 201-1 and configuration memory cells 601 may fit within a column of BRAMs 103.

Figure 8:
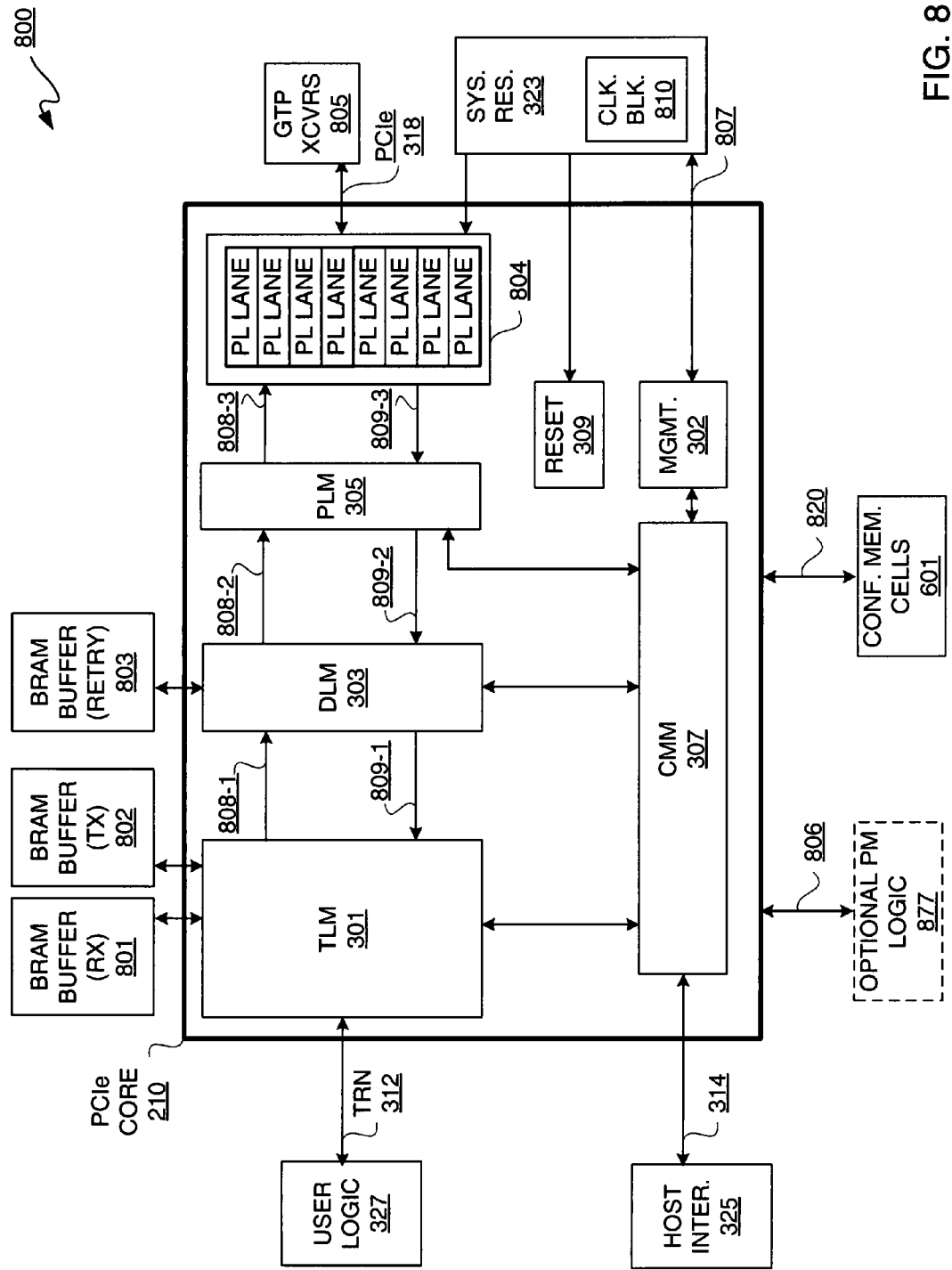
FIG. 8 is a block diagram depicting an exemplary embodiment of a PCIe core implemented in an FPGA.

FIG. 8 is a block diagram depicting an exemplary embodiment of a PCIe core 210 implemented in an FPGA 800. PCIe core 210 of FIG. 8 is generally PCIe core 210 of FIG. 3 with additional details illustratively shown. Notably, PCIe core 210 is an example of how each of PCIe cores 201-1 and 201-2 of FIGS. 5 and 6 may be implemented. Configuration memory cells 601 may be coupled to PCIe core 210 via configuration interface 820. Notably, configuration interface 820 may extend to each of modules 301, 303, 305, and 307, as well as reset block 309 and management block 302, of PCIe core 210.

Physical layer ("PL") lanes 804 are illustratively shown as being part of PCIe core 210. In this exemplary embodiment, PL lanes 804 are bi-directional, though there may be separate sets of uni-directional PL lanes. Additionally, receive and transmit buffers are illustratively shown as being implemented using BRAM, namely receive BRAM buffer 801 and transmit BRAM buffer 802 coupled to TLM 301. Furthermore, a retry buffer is illustratively shown as implemented using BRAM, namely retry BRAM buffer 803 coupled to DLM 303.

GTP transceivers 805 may be implemented using MGT transceivers of FPGA 800, which may be FPGA 100 of FIG. 1, and may be coupled to PL lanes 804. Any of 1, 2, 4, or 8 GTP transceivers 805 may be interfaced to PCIe core 210. System resources 323 may include a clock block 810. Additionally, a power management interface 806 may be used to provide power management of PCIe core 210 using optional power management ("PM") logic 877. Furthermore, system resources 323 may be coupled to management block 302 via status interface 807. Notably, management interface 314 may be used to couple management logic to CMM 307, as well as other management circuitry. Configuration and status interfaces described herein may further be coupled to TLM, DLM, PLM and CMM, though not necessarily illustratively shown for purposes of clarity.

Separate data input paths 808-1 through 808-3 and data output paths 809-1 through 809-3 are illustratively shown for communication among physical layer lanes 804, TLM 301, DLM 303, and PLM 305. Furthermore, it should be appreciated that BRAMs used to implement buffers 801 through 803 may be located in a same column as PCIe core 210, namely a column of FPGA 800, where FPGA 800 is of a columnar architecture. Alternatively, BRAMs used to implement buffers 801 through 803 may be in different columns.

With simultaneous reference to FIGS. 3, 6, and 8, configuration options that may be set via configuration memory cells 601 for PCIe cores 201-1 and 201-2 are described. One option is the number of physical layer lanes to be used. For this example implementation of 8 bi-directional physical layer lanes 804, three of configuration memory cells 601 may be used to provide the selected number of physical layer lanes to be used. The output of these configuration memory cells may be provided to PLM 305 for configuring the number of physical layer lanes to be used.

The number of virtual channels may be set by providing input information to TLM 301 and CMM 307 from output of configuration memory cells. The virtual channel arbitration scheme, which, for example, may be strict priority, round robin, or weighted round robin, may likewise be set by providing output from configuration memory cells 601 to TLM 301 and CMM 307.

The default for TLM 301 is to use it as provided in PCIe core 210. However, a user may wish to bypass TLM 301 and instead implement a version of TLM 301 in user logic 327, namely a soft transaction layer implemented in FPGA fabric. By having the ability to have TLM 301 implemented in programmable logic rather than PCIe core 210, Advanced Switching support may be facilitated for example.

Accordingly, TLM 301 optionally may be bypassed or otherwise optioned out of PCIe core 210. Accordingly, if TLM 301 is optioned out, user logic 327 may include TLM 301, and TLM 301 may interface with DLM 303. Thus, for example, TLM 301 may be optioned out of use by effectively multiplexing it in or out of PCIe core 210. Control signaling for such multiplexing of TLM 301 in or out of PCIe core 210 may come from one or more configuration memory cells of configuration memory cells 601.

Whether a PCIe Endpoint, Root Complex, Switch, Bridge or Advanced Switching block is upstream-facing or downstream-facing may be configured with output from configuration memory cells 601. This upstream/downstream-facing information may be provided to CMM 307 for operation of at least one of TLM 301, DLM 303, and PLM 305. Additionally, configurability with respect to whether a hard macro is to function as either a PCIe Endpoint, Root Complex, Switch, Bridge or Advanced Switching block may be set responsive to output from configuration memory cells 601. Examples of configurability of device/port type include the following configurations: PCIe Endpoint device, legacy PCIe Endpoint device, Root Port of PCIe Root Complex, Upstream Port of PCIe Switch, Downstream Port of PCIe Switch, PCIe to PCI/PCI-X Bridge, and PCI/PCI-X to PCIe Bridge.

Data link layer compatibility may be configured responsive to output from configuration memory cells 601. It should be appreciated that PCIe and Advanced Switching implementations may have different data link layers. Accordingly, whether PCIe or Advanced Switching is implemented, configuration information may indicate how the data link layer is to be configured. Notably, even though this configuration information is provided to CMM 307, it affects DLM 303.

Routing of configuration packets may be configured from information from configuration memory cells 601. The configuration information for routing of configuration packets is provided to CMM 307; however, TLM 301 may be affected by this information.

Another configurable feature provided via configuration memory cells 601 is variable buffer sizes for receive buffer 801, transmit buffer 802, or a retry buffer 803. Additionally, latency for buffers 801 through 803 may be varied. Variability of buffer size and latency may be configured responsive to output from configuration memory cells 601 as provided to TLM 301 for buffers 801 and 802 and to DLM 303 for buffer 803. Additionally, there may be variable partitioning of receive buffer 801 and transmit buffer 802 into various first-in, first-out buffers ("FIFOs"). This variable partitioning may be for posted, non-posted, or completion packets. Furthermore, this variable partitioning may be used for partitioning between different virtual channels. Notably, this configurability is associated with TLM 301.

Configurability of interface sizes may be provided via use of configuration memory cells 601. The interface sizes of receive buffer 801, transmit buffer 802, and retry buffer 803 may be varied, for example, such as between a 32-bit wide and a 64-bit wide interface. Additionally, TRN 312 interface width may be varied, for example, such as between a 32-bit wide and a 64-bit wide interface.

Other features of PCIe core 210 configurable via configuration memory cells 601 are the number of fast training sequences, maximum payload supported, and base address register configuration, which are separate selectable configurations associated with CMM 307. Notably, the base address register configuration may include the number of base address registers, whether the base address register is configured for memory or I/O space, base address width, or whether a base address is pre-fetchable.

Vendor identification, device identification, revision identification, sub-system vendor identification, sub-system identification, class code, device serial number, port number, and extended capabilities supported are all separate configurable parameters which may be configured by programming configuration memory cells 601. Each of these configurable parameters is associated with CMM 307.

Additionally slot capabilities are configurable responsive to programming configuration memory cells 601. Examples of slot capabilities include an attention button present indicator, a power controller present indicator, a Manually-operated Retention Latch ("MRL") sensor present indicator, an attention indicator present indicator, a power indicator present indicator, a hot plug surprise indicator, a hot plug capable indicator, a slot power limit indicator, and a physical slot number indicator. Additionally, slot clock configuration is a configurable parameter responsive to programming configuration memory cells 601. Slot capabilities are associated with CMM 307.

A multi-message capability is configurable via using configuration memory cells 601, and this will affect TLM 301. Power management capabilities may be configured responsive to programming of configuration memory cells 601. Examples of power management capabilities include device specific initialization, power management state ("D1") support, power management state ("D2") support, Power Management Event ("PME") support, auxiliary current support, power management data, and scale. Power budgeting capabilities may also be configured using configuration memory cells 601. Examples of power budgeting capabilities include base power, data scale, PM sub-state, PM state, type, and power rail.

The number of reset domains, as well as whether reset pins are controlled as independent domains or have a hierarchical relationship, may be configured using configuration memory cells 601. Additional details regarding reset domains are described in the above-mentioned co-pending and commonly assigned patent application entitled "Interface Device Reset," by Dai D. Tran, et al., the contents of which have been incorporated by reference herein in their entirety. The number of reset domains affects reset block 309, and may be configured responsive to programming configuration memory cells 601.

Whether or not data scrambling is disabled is a configurable parameter responsive to using configuration memory cells 601, which affects PLM 305. Initial flow control credit values to be advertised are configurable responsive to programming configuration memory cells 601 and affect DLM 303. Phantom function support, extended tag support, and read completion boundary control are separately configurable features which may be programmed using configuration memory cells 601 and affect CMM 307.

While the foregoing describes exemplary embodiment(s) in accordance with one or more aspects of the invention, other and further embodiment(s) in accordance with the one or more aspects of the invention may be devised without departing from the scope thereof, which is determined by the claim(s) that follow and equivalents thereof. Claim(s) listing steps do not imply any order of the steps. Trademarks are the property of their respective owners.

What is claimed is:

1. An integrated circuit, comprising:
a first core being a hard macro which is an application specific circuit version of a Peripheral Component Interconnect Express ("PCIe") interface device;
first configuration memory cells associated with the first core;
the first configuration memory cells being coupled to the first core to drive first inputs of the first core for configuring the hard macro;
the first configuration memory cells capable of being written to by a user for configuring the hard macro to operate as a PCIe system element type selected from a group consisting of a Root Complex, an Endpoint, a Bridge, and an Advanced Switch; and
the first configuration memory cells programmable responsive to a first portion of a configuration bitstream, the configuration bitstream capable of including user logic information for programming the integrated circuit.

2. The integrated circuit according to claim 1, wherein the integrated circuit has a columnar architecture; and
wherein the first core and the first configuration memory cells are co-located in a column of the integrated circuit.

3. The integrated circuit according to claim 2, wherein the first core and the first configuration memory cells in combination have a cumulative width which is not greater than width of the column.

4. The integrated circuit according to claim 3, wherein the column includes block random access memory and an Ethernet Media Access Controller; and
wherein the integrated circuit is a programmable logic device.

5. The integrated circuit according to claim 2, further comprising:

a second core which is another hard macro and which is a copy of the first core and is co-located in the column with the first core;

second configuration memory cells associated with the second core, the second configuration memory cells for initializing the second core;

the second configuration memory cells being coupled to the second core to drive second inputs of the second core for configuring the other hard macro; and the second configuration memory cells programmable responsive to a second portion of the configuration bitstream.

6. The integrated circuit according to claim 1, wherein the first configuration memory cells are usable for setting an identifier selected from a group consisting of a vendor identification, a device identification, a revision identification, a subsystem vendor identification, a subsystem identification, a class code, a device serial number, and a port number for the first core responsive to the first portion of the configuration bitstream.

7. The integrated circuit according to claim 1, wherein the first configuration memory cells are usable for setting a number of lanes and a number of virtual channels for the first core responsive to the first portion of the configuration bitstream.

8. The integrated circuit according to claim 1, wherein the first configuration memory cells are usable for setting virtual channel arbitration for the first core responsive to the first portion of the configuration bitstream, the virtual channel arbitration being at least one arbitration scheme selected from a group consisting of a strict priority mode, a round robin mode, and a weighted round robin mode.

9. The integrated circuit according to claim 1, wherein the first configuration memory cells are usable for setting variable buffer sizes, variable buffer latencies, buffer interface width size, user application interface width, and variable buffer partitions for the first core responsive to the first portion of the configuration bitstream.

10. The integrated circuit according to claim 9, wherein the variable buffer sizes and the variable latencies are for buffers associated with transmit buffering, receive buffering, and retry buffering.

11. The integrated circuit according to claim 9, wherein the variable buffer partitions are for buffers associated with transmit buffering and receive buffering, the transmit buffering and the receive buffering capable of being partitioned into first-in, first-out buffers for posted, non-posted, and completion packets.

12. The integrated circuit according to claim 11, wherein the variable buffer partitions are further for partitioning the buffers among different virtual channels.

13. The integrated circuit according to claim 9, wherein the user application interface width is for communicating with user logic instantiated in programmable logic of the integrated circuit.

14. The integrated circuit according to claim 1, wherein the first configuration memory cells are usable for setting maximum payload supported, base address register configuration, Extended Capabilities, slot capabilities, multi-message capability, power management capabilities, power budgeting capabilities, slot clock configuration, deactivation of data scrambling, initial flow control credit values to advertise, Phantom function support, Extended tag support, read completion boundary control, and number of Fast Training Sequences for the first core responsive to the first portion of the configuration bitstream.

15. The integrated circuit according to claim 1, wherein the first configuration memory cells are usable for setting data link layer compatibility, facing direction, routing of configuration packets, and the system element type for the first core responsive to the first portion of the configuration bitstream, the data link layer compatibility being associated with a data layer module of the first core being configured for either a PCIe protocol or an Advanced Switching protocol, and the facing direction being either upstream-facing or downstream-facing.

16. The integrated circuit according to claim 1, wherein the first configuration memory cells are usable for setting transaction layer status for the first core responsive to the first portion of the configuration bitstream, the transaction layer status for selecting between using a hard macro version of a first transaction layer module included as part of the first core and using a soft macro version of a second transaction layer module instantiated as part of user logic in programmable logic responsive to the user logic information.

17. A method for configuration of an integrated circuit, comprising:

tiling at least a portion of a column of a columnar programmable device by repeated application of a core, the core being a hard macro which is an application specific circuit version of a Peripheral Component Interconnect Express ("PCIe") interface device;

each instance of the core configurable responsive to programming configuration memory respectively associated therewith;

the configuration memory capable of being written to by a user for configuring the hard macro to operate as a PCIe system element type selected from a group consisting of a Root Complex, an Endpoint, a Bridge, and an Advanced Switch;

allowing for a bitstream to be provided to the integrated circuit for configuring the integrated circuit, the bitstream capable of having information for each instance of the core for programming the configuration memory respectively associated therewith for the configuring of the hard macro to operate as the system element type selected; and driving inputs from control ports of configuration memory cells of the configuration memory for the configuring of the hard macro.

18. The method according to claim 17, wherein the configuration memory is programmable responsive to the information for setting a vendor identification, a device identification, a revision identification, a subsystem vendor identification, a subsystem identification, a class code, a device serial number, a port number, number of Fast Training Sequences, maximum payload supported, base address register configuration, Extended Capabilities, slot capabilities, multi-message capability, power management capabilities, power budgeting capabilities, slot clock configuration, deactivation of data scrambling, initial flow control credit values to advertise, Phantom function support, Extended tag support, and read completion boundary control for each instance of the core.

19. The method according to claim 17, wherein the configuration memory is programmable responsive to the information for setting a number of lanes, a number of virtual channels, virtual channel arbitration, variable buffer sizes, variable buffer latencies, buffer interface width size, user application interface width, variable buffer partitions, data link layer compatibility, facing direction, routing of configuration packets, and the system element type for each instance of the core.

20. The method according to claim 17, wherein the configuration memory is programmable responsive to the information for setting transaction layer status for each instance of the core, the transaction layer status for selecting between using a hard macro version of a first transaction layer module included as part of each instance of the core and using a soft macro version of a second transaction layer module instantiated responsive to the bitstream as part of user logic, the user logic being instantiated in programmable logic of the columnar programmable device responsive to the bitstream.

* * * * *